(12) United States Patent
Shih et al.

(10) Patent No.: US 8,129,726 B2
(45) Date of Patent: Mar. 6, 2012

(54) LIGHT-EMITTING DIODE PACKAGE HAVING ELECTROSTATIC DISCHARGE PROTECTION FUNCTION AND METHOD OF FABRICATING THE SAME

(75) Inventors: Chih-Tsung Shih, Hsinchu (TW); Chen-Peng Hsu, Kaohsiung (TW); Kuan-Chieh Tu, Taipei (TW); Hung-Lieh Hu, Hsinchu (TW); Bing-Ru Chen, Pingtung County (TW); Shih-Tsai Huang, Taipei County (TW); Hsin-Yun Tsai, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 458 days.

(21) Appl. No.: 12/181,332

(22) Filed: Jul. 29, 2008

(65) Prior Publication Data
US 2009/0290273 A1    Nov. 26, 2009

Related U.S. Application Data

(63) Continuation-in-part of application No. 11/147,185, filed on Jun. 8, 2005, now Pat. No. 7,521,724.

(30) Foreign Application Priority Data

May 21, 2008    (TW) ................................ 97118800 A

(51) Int. Cl.
*H01L 27/15* (2006.01)
(52) U.S. Cl. ................ 257/79; 257/82; 257/83; 257/84; 438/237; 438/328
(58) Field of Classification Search .............. 257/82–84, 257/79; 438/237, 328, FOR. 157
See application file for complete search history.

(56) References Cited

U.S. PATENT DOCUMENTS

| 6,333,522 | B1 | 12/2001 | Inoue et al. |
| 6,441,404 | B1 * | 8/2002 | Yamamoto ...................... 257/99 |
| 6,642,072 | B2 | 11/2003 | Inoue et al. |
| 7,535,089 | B2 * | 5/2009 | Fitzgerald ...................... 257/684 |
| 2006/0138436 | A1 * | 6/2006 | Chen et al. ...................... 257/98 |
| 2007/0105256 | A1 | 5/2007 | Fitzgerald |

FOREIGN PATENT DOCUMENTS

CN    1874013 A    12/2006

* cited by examiner

*Primary Examiner* — Jerome Jackson, Jr.
*Assistant Examiner* — Dale E Page
(74) *Attorney, Agent, or Firm* — Rabin & Berdo, P.C.

(57) ABSTRACT

A light-emitting diode (LED) package having electrostatic discharge (ESD) protection function and a method of fabricating the same adopt a composite substrate to prepare an embedded diode and an LED, and use an insulating layer in the composite substrate to isolate some individual embedded diodes, such that the LED device has the ESD protection.

29 Claims, 18 Drawing Sheets

LIGHT-EMITTING DIODE PACKAGE HAVING ELECTROSTATIC DISCHARGE PROTECTION FUNCTION AND METHOD OF FABRICATING THE SAME

CROSS-REFERENCE TO RELATED APPLICATIONS

This non-provisional application claims priority under 35 U.S.C. §119(a) on Patent Application No(s). 097118800 filed in Taiwan, R.O.C. on May 21, 2008 the entire contents of which are hereby incorporated by reference. This application also is a continuation-in-part application of application Ser. No. 11/147,185, filed Jun. 8, 2005, which is now patented with a U.S. Pat. No. 7,521,724.

BACKGROUND OF THE INVENTION

1. Field of Invention

The present invention relates to a light-emitting diode (LED) package, in particular, to an LED package having an electrostatic discharge (ESD) protection function and a method of fabricating the same.

2. Related Art

The LEDs formed by a semiconductor material of element compounds are light-emitting components of a wide bandgap, which may emit light covering all spectrum ranges. Since the increasingly improved light-emitting efficiency of the LEDs, the LEDs have gradually replaced fluorescent lamps and incandescent lamps in some fields, for example, in the fields of the backlight sources of the LCDs or the common illumination devices. Moreover, the LEDs have the advantages of preferred light-emitting efficiency and additionally a small volume, low power consumption, and a long lifespan, so the LEDs have been widely used in the home appliance, computer and its peripheral products, or communication products.

It should be noted that although the LEDs have the above advantages, the LEDs are usually damaged due to the abnormal voltage or electrostatic discharge (ESD). Therefore, U.S. patents such as U.S. Pat. No. 6,642,072 B2 or U.S. Pat. No. 6,333,522 B1 have disclosed disposing a Zener diode on an LED in a parallel connection manner. In this manner, under the normal operating voltage, the LED is forward biased to function normally. However, when an abnormal voltage or an electrostatic voltage is produced, the over-high voltage may discharge through the Zener diode operating in the breakdown region. Therefore, the LED is protected from being damaged.

SUMMARY OF THE INVENTION

The present invention is directed to a method of fabricating an LED package having an ESD protection function, which includes the following steps. First, a composite substrate including a first silicon substrate, an insulating layer, and a second silicon substrate is provided. Then, an embedded diode is formed in the first silicon substrate. Next, a groove is formed in the first silicon substrate to separate two independent semiconductor regions. At least one isolation trench is formed in the second silicon substrate and the insulating layer, the groove is disposed corresponding to the isolation trench, and the insulating layer divides the composite substrate into the contact surfaces of positive and negative electrodes. After that, at least one wire is formed as an electrode on the positive electrode contact surface and the negative electrode contact surface respectively, for respectively defining a positive electrode and a negative electrode of the composite substrate. The composite substrate is electrically connected to the embedded diode, and an electrode direction of the embedded diode is opposite to that of the composite substrate. Finally, at least one LED is disposed in the groove, and the LED has a positive electrode and a negative electrode which are electrically connected to the positive electrode and the negative electrode of the composite substrate.

The present invention is further directed to an LED package structure having an ESD protection, which includes a composite substrate, a first electrode, a plurality of second electrodes, an LED, and an embedded electronic device. The composite substrate includes a first semiconductor region, a second semiconductor region, and a groove located between the first semiconductor region and the second semiconductor region. The first electrode is disposed between the first semiconductor region and the groove. The second electrodes are respectively located between the first semiconductor region or the second semiconductor region and the groove. The first electrode is electrically insulated from the second electrodes. The second electrodes are electrically connected to each other. The LED is disposed in the groove and has two electrode ends which are respectively connected to the first electrode and one of the second electrodes. The embedded electronic device is embedded in the first semiconductor region and has two electrode ends, and the two electrode ends of the embedded diode are electrically connected to the first electrode and another second electrode respectively. The embedded electronic device includes a embedded diode. The forward bias direction of the embedded diode relative to the first electrode and the second electrodes is opposite to the forward bias direction of the LED relative to the first electrode and the second electrodes.

The present invention is further directed to an ESD protection system for an LED, which includes a composite substrate and an LED. The composite substrate includes a first silicon substrate, an insulating layer, and a second silicon substrate arranged in sequence. The composite substrate has a groove and an isolation trench. The groove is disposed corresponding to the isolation trench, for defining a positive electrode contact surface and a negative electrode contact surface of the composite substrate. The composite substrate further includes an ESD protection circuit embedded in the first silicon substrate or the second silicon substrate. The LED is disposed in the groove and has two electrode ends which are electrically connected to the positive electrode contact surface and the negative electrode contact surface respectively, and the LED is electrically connected to the ESD protection circuit. The ESD protection circuit has an electrode direction opposite to that of the LED electrode.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1A:
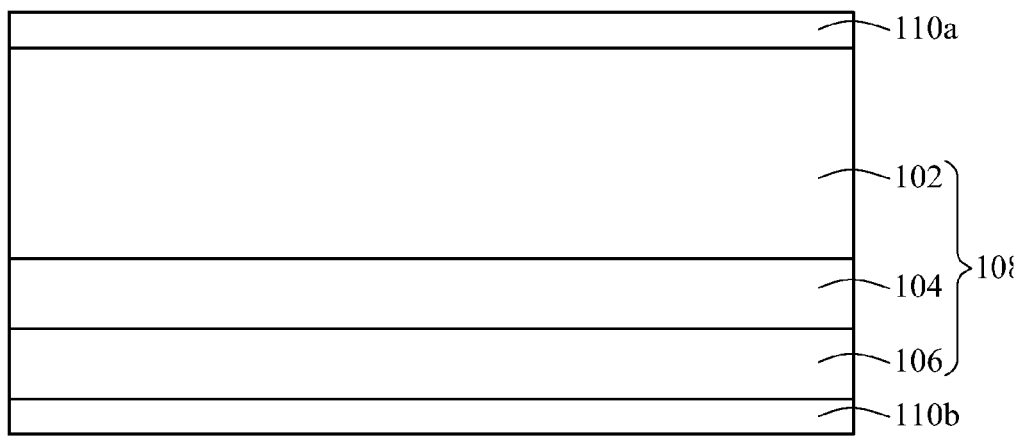
FIGS. 1A-1H show schematic flow charts of procedures of a method of fabricating an LED device having an ESD protection function according to a first embodiment of the present invention.

FIGS. 1A-1G show schematic flow charts of procedures of a method of fabricating an LED device having an ESD protection function according to a first embodiment of the present invention. First, as shown in FIG. 1A, a composite substrate 108 including a first silicon substrate 102, an insulating layer 104, and a second silicon substrate 106 is provided. The first silicon substrate 102 is a P-type semiconductor silicon substrate or an N-type semiconductor silicon substrate, and the first silicon substrate 102 has a thickness of 0.1 µm to 500 µm. The thickness of the first silicon substrate 102 may be adjusted according to the desired flexibility, e.g., the thickness may be 0.1 µm to 0.3 µm or 400 µm to 500 µm.

Figure 1B:
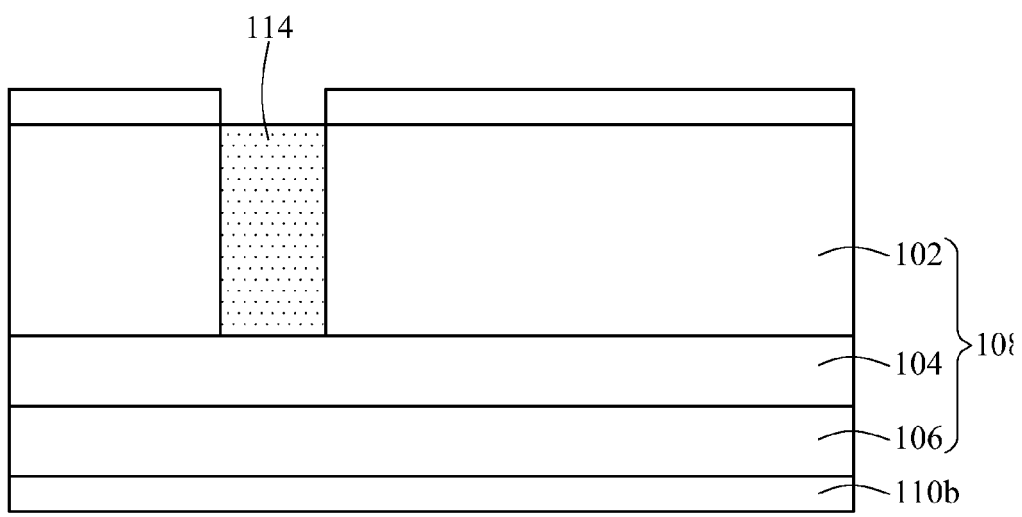
Figure 1C:
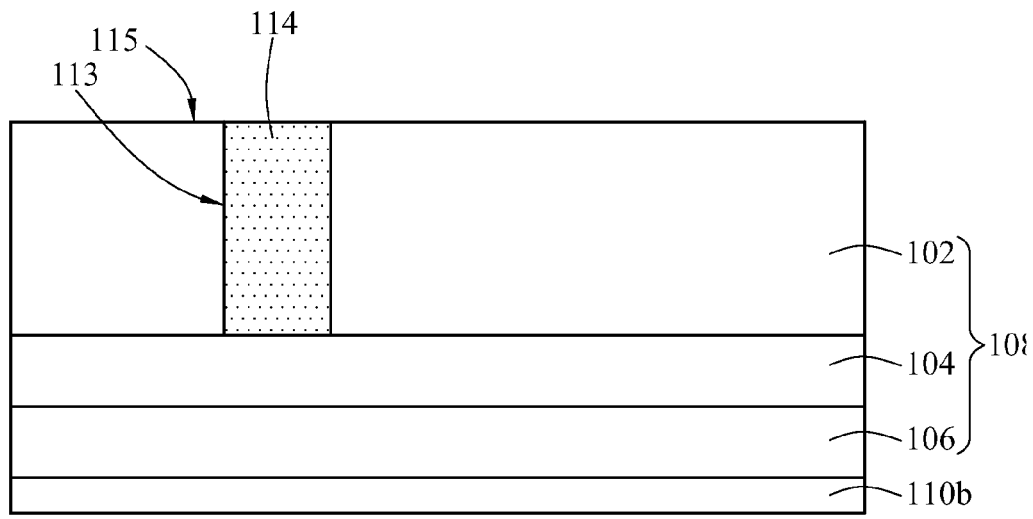

Then, a first photoresist layer 110a and a second photoresist layer 110b are respectively formed on the first silicon substrate 102 and the second silicon substrate 106. Next, as shown in FIG. 1B, a photolithography process is performed on the first photoresist layer 110a to form a first patterned photoresist layer. After that, a semiconductor having a type different from the first silicon substrate 102 is doped into the first silicon substrate 102 with the first patterned photoresist layer as a mask, so as to form a embedded diode in the first silicon substrate 102. For example, when the first silicon substrate 102 is, for example, a P-type semiconductor silicon substrate, an ion implantation process is performed on the first silicon substrate 102 without the first patterned photoresist layer covered thereon, so as to form an N-type semiconductor region 114 in the first silicon substrate 102, and vice versa. In this manner, a embedded diode 115 having a PN junction interface 113 is formed in the first silicon substrate 102, as shown in FIG. 1C. The embedded diode 115 is, for example, a Zener diode, a Schottky diode, or a diode formed by elements of groups III and V. Furthermore, the embedded diode 115 may have a plurality of PN junction interfaces, such as PNP diode or NPN diode. Next, a P-type semiconductor silicon substrate is taken as an example of the first silicon substrate 102 for illustration, which is not intended to limit the present invention, and persons skilled in the art may make some alternations according to the spirit of the present invention.

Figure 1D:
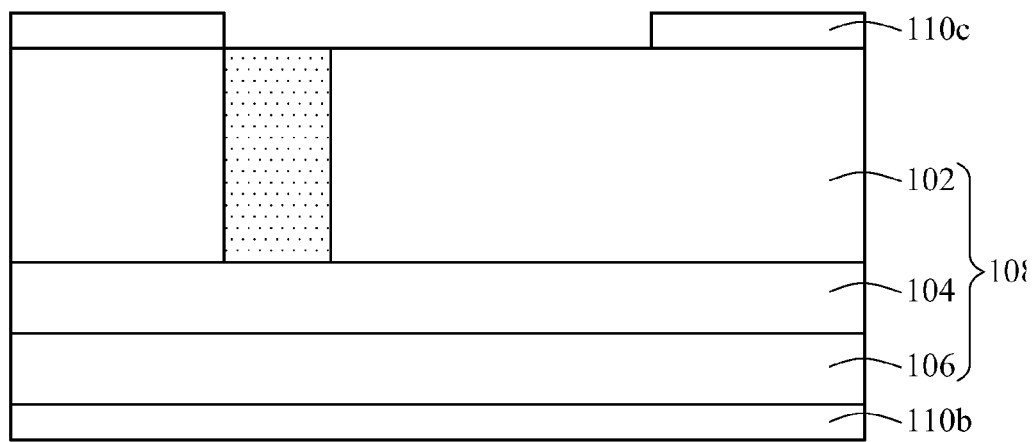
Figure 1E:
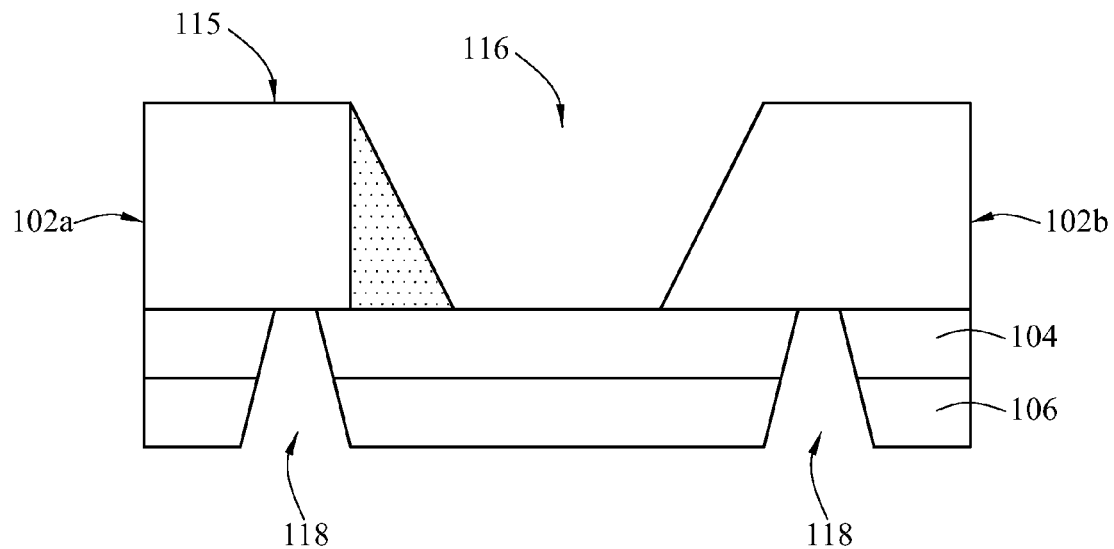

As shown in FIG. 1D, a patterned photoresist layer 110c is formed on the first silicon substrate 102, and an etching region that is needed in the subsequent process is exposed. As shown in FIG. 1E, an etching process is performed on the first silicon substrate 102, so as to form a groove 116 having a slope. The groove 116 is adjacent to the embedded diode 115, and separates the first silicon substrate 102 into two semiconductor regions 102a and 102b. Meanwhile, a photolithography process is performed on the second photoresist layer 110b, so as to form a second patterned photoresist layer (not shown). After that, the second patterned photoresist layer is used as a mask to etch the exposed second silicon substrate 106, so as to form at least one isolation trench 118 in the second silicon substrate 106 and the insulating layer 104. The isolation trench 118 is disposed corresponding to the groove 116, so as to divide the composite substrate 108 into a positive electrode contact surface and a negative electrode contact surface. As shown in FIG. 1E, the isolation trench 118 and the groove 116 are disposed alternately. In practice, a dry-etching process may be performed on the first silicon substrate 102 as required, so as to etch the groove 116 having a slope or a groove having a vertical surface (not shown).

Figure 1F:
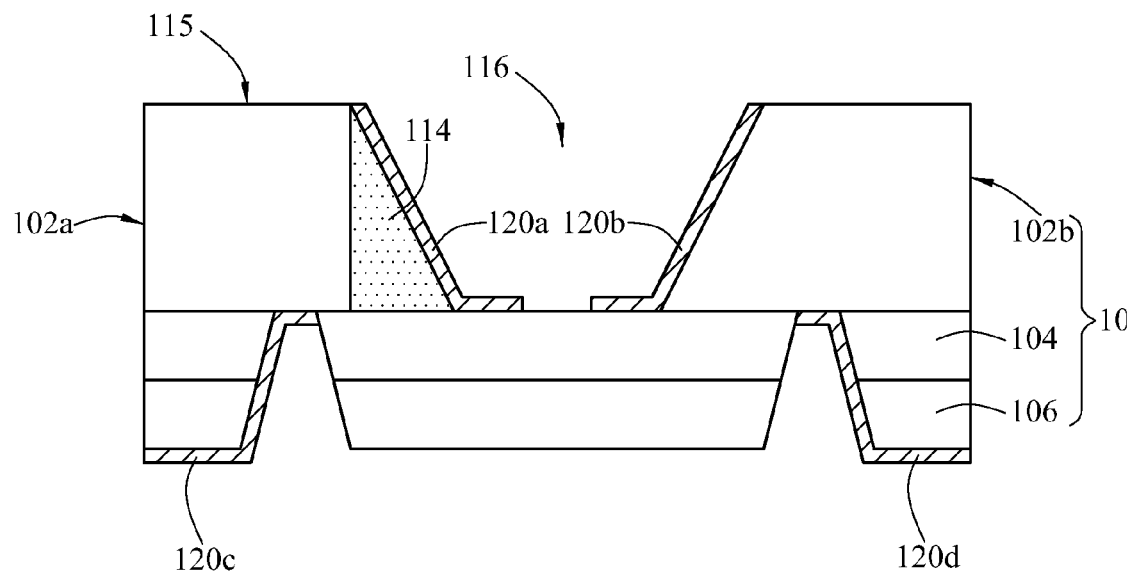

As shown in FIG. 1F, a plurality of wires are respectively formed on the positive electrode contact surface and negative electrode contact surface to serve as electrodes 120a-120d, for defining a positive electrode and a negative electrode of the composite substrate 108. The composite substrate 108 is electrically connected to the embedded diode 115, and an electrode direction of the embedded diode 115 is opposite to that of the composite substrate 108.

Figure 1G:
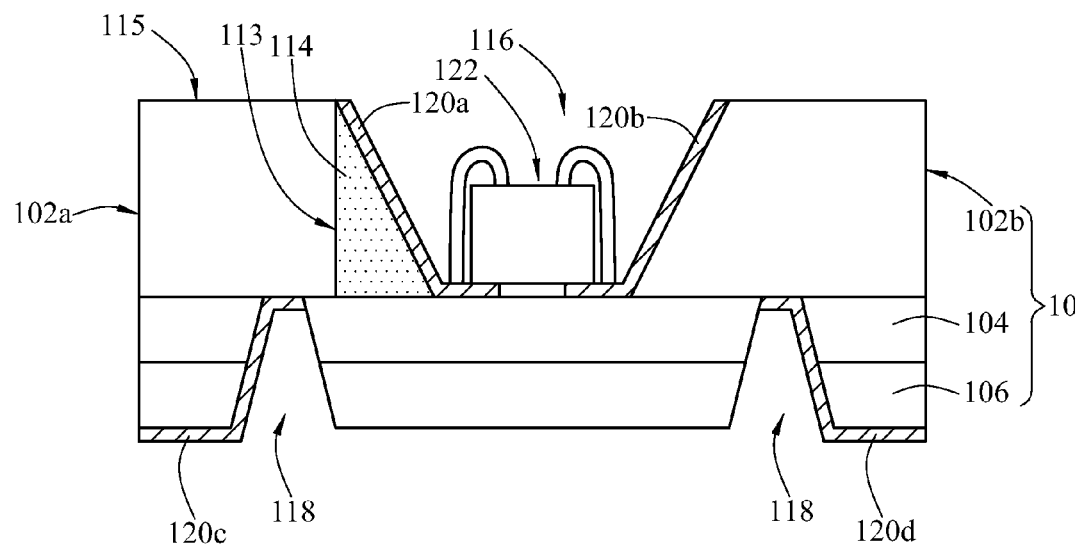
Figure 1H:
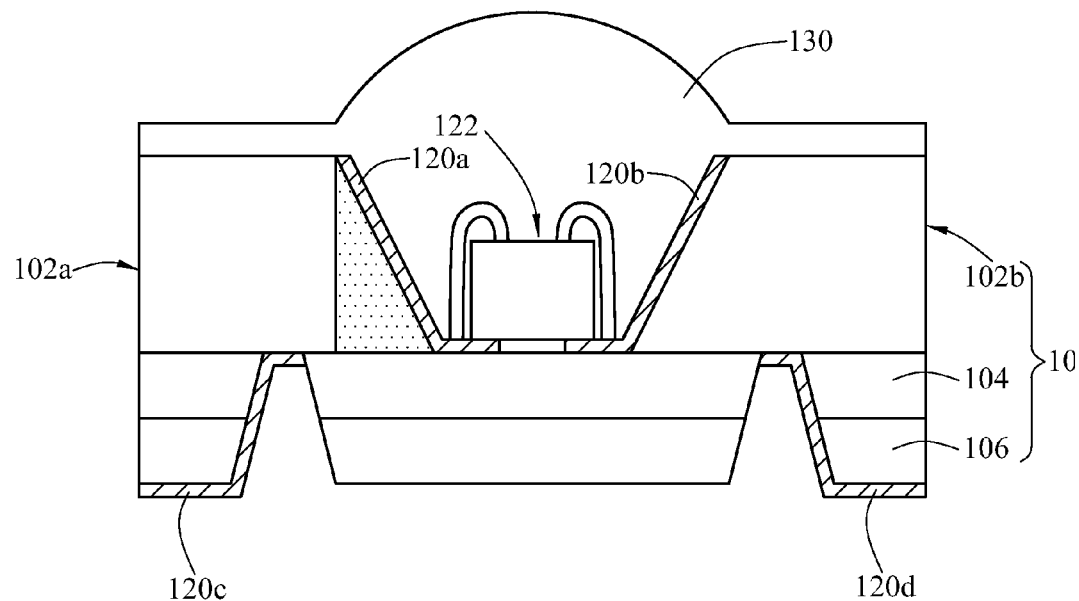

As shown in FIG. 1G, at least one LED 122 is disposed in the groove 116. The positive electrode and the negative electrode of the LED 122 are electrically connected to the positive electrode and the negative electrode of the composite substrate 108 respectively. Furthermore, a encapsulating filling 130 may be filled into the groove 116 (as shown in FIG. 1H) to cover the LED 122. Moreover, a reflecting layer (not shown) may be further coated on the inner surface of the groove 116 as required, so as to reflect the light generated by the LED 122.

The encapsulating filling 130 may be one selected from among epoxy resin, silicon gel, polymer, and any combination thereof. And, the encapsulating filling may be mixed with fluorescent powders or other dyes. Furthermore, the encapsulating filling may also be prepared in the form of lens for changing direction of the light emitted from the LED 122. As shown in FIG. 1H, the encapsulating filling 130 is prepared in the form of a single convex lens, which may change direction of the light emitted by the LED 122 and meanwhile enhance the overall luminance.

Figure 2:
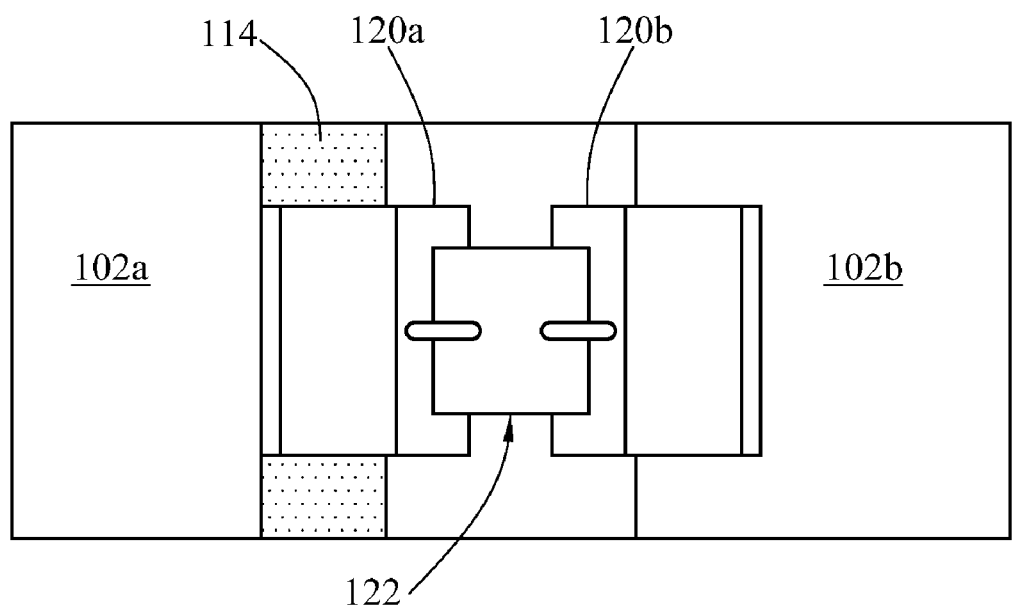
FIG. 2 is a top view of FIG. 1G according to the first embodiment of the present invention.

FIG. 2 is a top view of FIG. 1G according to the first embodiment of the present invention. In other words, FIG. 1G is a schematic sectional structural view taken along the AA line in FIG. 2. Referring to FIGS. 1G and 2, the composite substrate 108 includes a first semiconductor region 102a, a second semiconductor region 102b, and a groove 116 located between the first semiconductor region 102a and the second semiconductor region 102b, so as to electrically isolate the first semiconductor region 102a and the second semiconductor region 102*b*. The first electrode 120*a* is disposed on the first semiconductor region 102*a* and the groove 116, and the second electrode 120*b* is disposed on the second semiconductor region 102*b* and the groove 116. The first electrode 120*a* and the second electrode 120*b* are electrically insulated. The LED 122 is disposed in the groove 116 and has two electrode ends, i.e., the positive electrode end and the negative electrode end (not shown) which are electrically connected to the first electrode 120*a* and the second electrode 102*b* respectively.

Then, referring to FIG. 1G, the other side of the composite substrate 108 not having the first semiconductor region 102*a* and the second semiconductor region 102*b* is provided with at least one isolation trench 118. The isolation trench 118 penetrates from the lower surface of the second silicon substrate 106 to the upper surface of the insulating layer 104, and the isolation trench 118 and the groove 116 are disposed alternately to form a plurality of electrode contact surfaces. The third electrode 120*c* and the fourth electrode 120*d* are respectively disposed on the isolation trenchs 118. In this embodiment, the third electrode 120*c* and the fourth electrode 120*d* are disposed on the lower surface of the composite substrate 108, and electrically connected to a circuit board (not shown). The embedded diode 115 is embedded in the first semiconductor region 102*a* and has two electrode ends, i.e., N-electrode end and P-electrode end which are electrically connected to the first electrode 120*a* and the third electrode 120*c* respectively. The forward bias direction of the embedded diode 115 relative to the first electrode 120*a* and the second electrode 120*b* is opposite to the forward bias direction of the LED relative to the first electrode 120*a* and the second electrode 120*b*.

Figure 3:
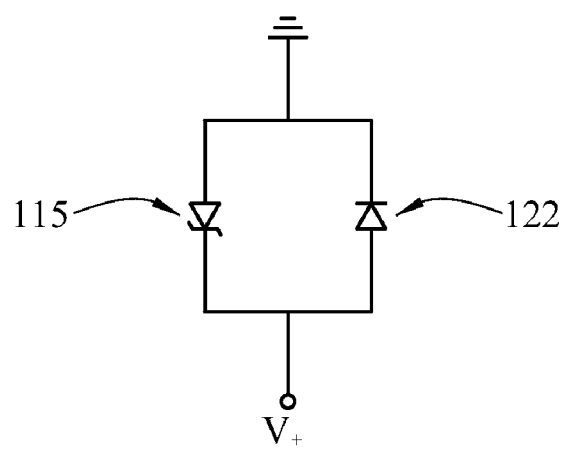
FIG. 3 is an equivalent circuit of an LED package having an ESD protection function according to the present invention.

In other words, FIG. 3 shows an equivalent circuit of the LED package having an ESD protection function according to the present invention. The embedded diode 115 is connected in parallel to the LED 122. The positive electrode and the negative electrode of the LED 122 are electrically connected to the first electrode 120*a* and the second electrode 120*b* respectively. The embedded diode 115 has the N-electrode end and the P-electrode end which are electrically connected to the first electrode 120*a* and the third electrode 120*c* respectively. Therefore, when a forward bias is applied on two ends V+ and V− (or a ground end) of the LED device, for example, the first electrode 120*a* is electrically connected to V+, the third electrode 120*c* is electrically connected to V−, and the fourth electrode 120*d* is electrically connected to V−, the LED 122 is forward biased and can function normally. Meanwhile, the embedded diode 115 is a reverse biased, and the breakdown voltage of the embedded diode 115 is not reached, so the embedded diode 115 is not conducted. However, once the abnormal high-voltage static is produced, such as 1000 volts, the over-high voltage may discharge through the N-electrode end and the P-electrode end of the embedded diode 115, and will not pass through the LED 122. Therefore, the LED 122 will not be damaged by the abnormal voltage and the electrostatic discharge of a high bias.

Figure 4A:
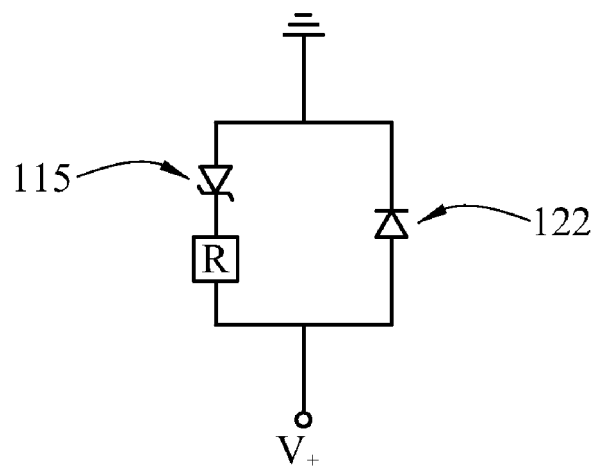
FIGS. 4A-4E show equivalent circuit diagrams of the LED package according to the present invention.

Furthermore, a resistor R may be disposed in the embedded electronic device as required, and the resistor R is connected in series with the embedded diode, for greatly reducing the large current produced during the ESD. The equivalent circuit diagram is as shown in FIG. 4A. The resistor R is formed in the step of forming the embedded diode, and the required resistance is achieved by adjusting the concentration of the doped semiconductor type.

Figure 4B:
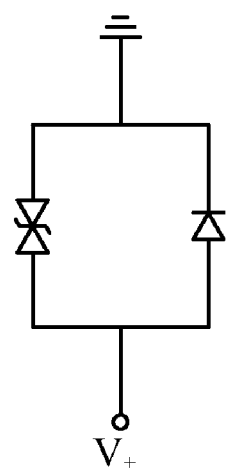
Figure 4C:
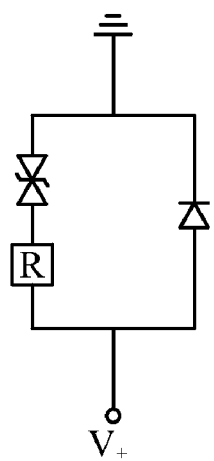
Figure 4D:
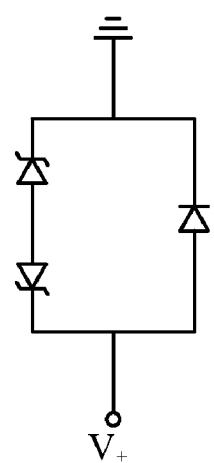
Figure 4E:
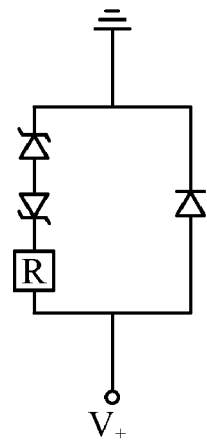

Moreover, two embedded diodes may also be disposed as required, as shown in FIG. 4B, which are two bidirectional embedded diodes 115. And meanwhile, a resistor R may be disposed in the system having two bidirectional embedded diodes 115, or a resistor R may be further disposed to be connected in series with the bidirectional embedded diode, as shown in FIG. 4C. Or, as shown in FIG. 4D, the two embedded diodes 115 disposed in the opposite directions are arranged in series, and may also be connected in series to a resistor R, as shown in FIG. 4E.

Figure 5:
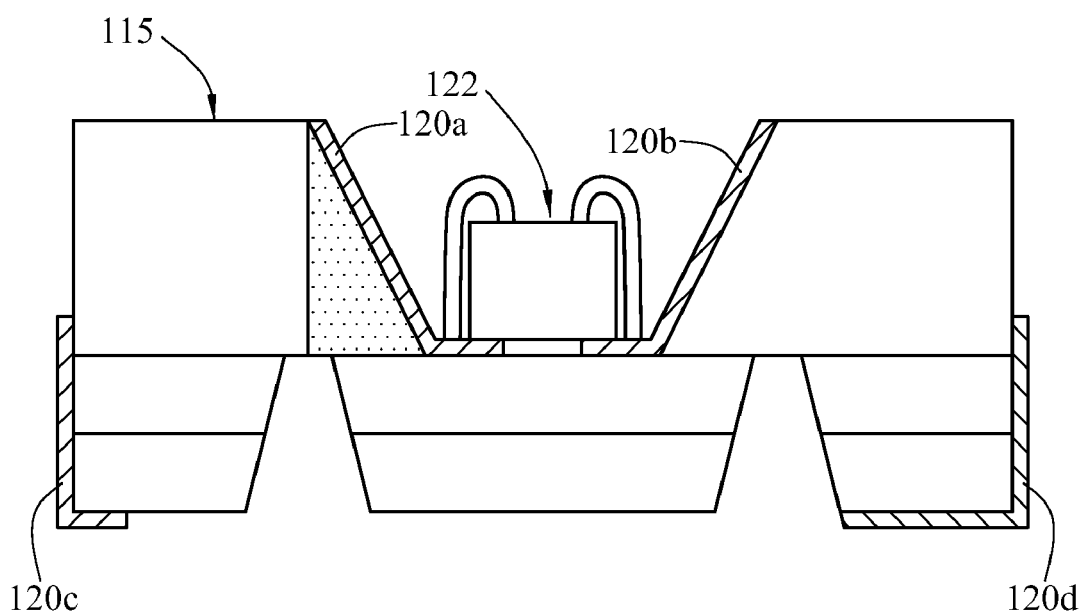
FIGS. 5-6 show schematic sectional views of a different structure aspect of the LED device having an ESD protection function according to the first embodiment of the present invention.

Next, the position of the electrodes 120*a*-120*d* may be adjusted according to different requirements. For example, as shown in FIG. 5, the third electrode 120*c* and the fourth electrode 120*d* are disposed on the outer surface of the composite substrate 108. The third electrode 120*c* is electrically connected to the P-electrode end of the embedded diode 115 to serve as a ground end of the LED device. The fourth electrode 120*d* is electrically connected to the second semiconductor region 102*b* to serve as a ground end of the LED device, and thus the equivalent circuit in FIG. 3 may also be formed.

Figure 6:
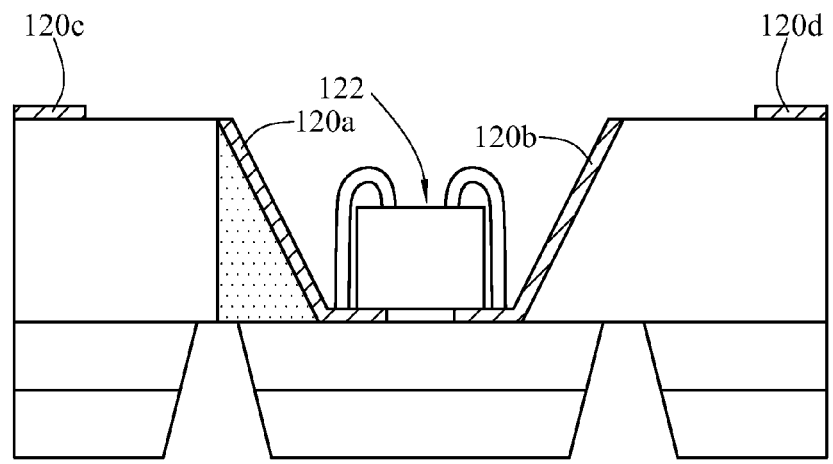

Or, as shown in FIG. 6, the third electrode 120*c* and the fourth electrode 120*d* may also be disposed on the surface of the first semiconductor region 102*a* and the second semiconductor region 102*b* to serve as two ground ends of the LED device, so as to form the equivalent circuit in FIG. 3.

Figure 7:
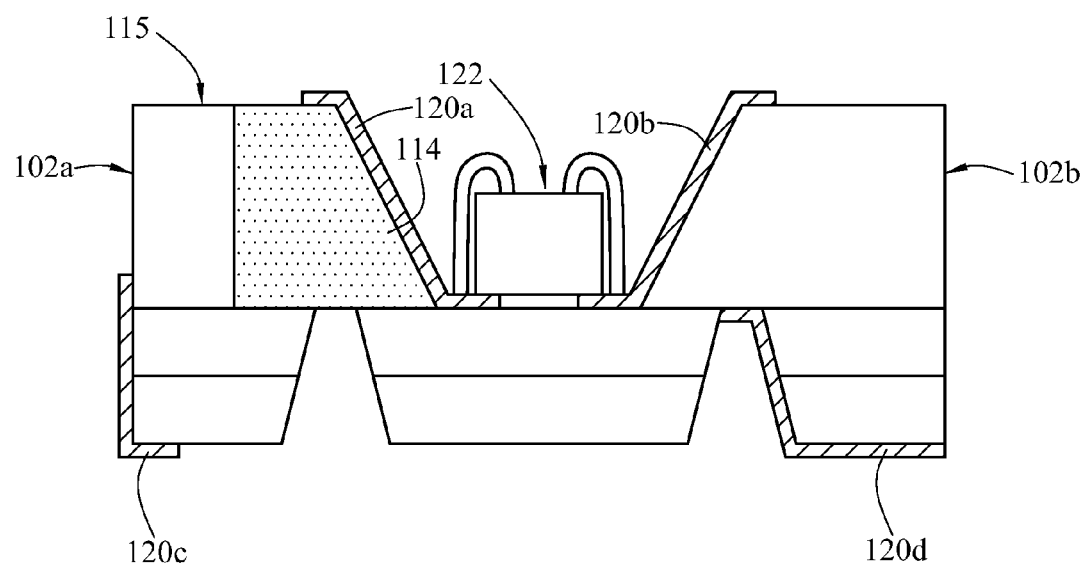
FIGS. 7-9 show schematic sectional structural views of an LED device having an ESD protection function according to a second embodiment of the present invention.
Figure 8:
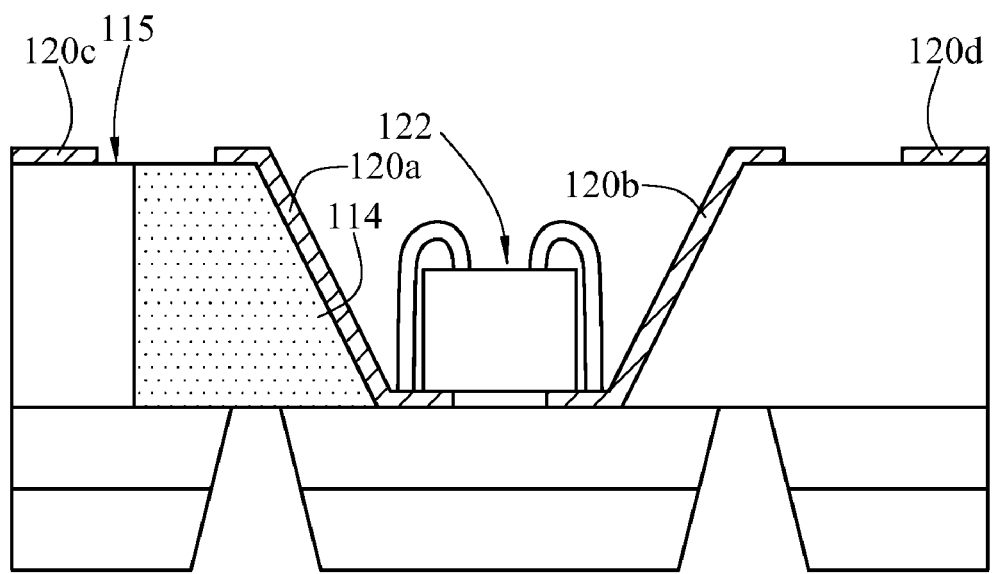
Figure 9:
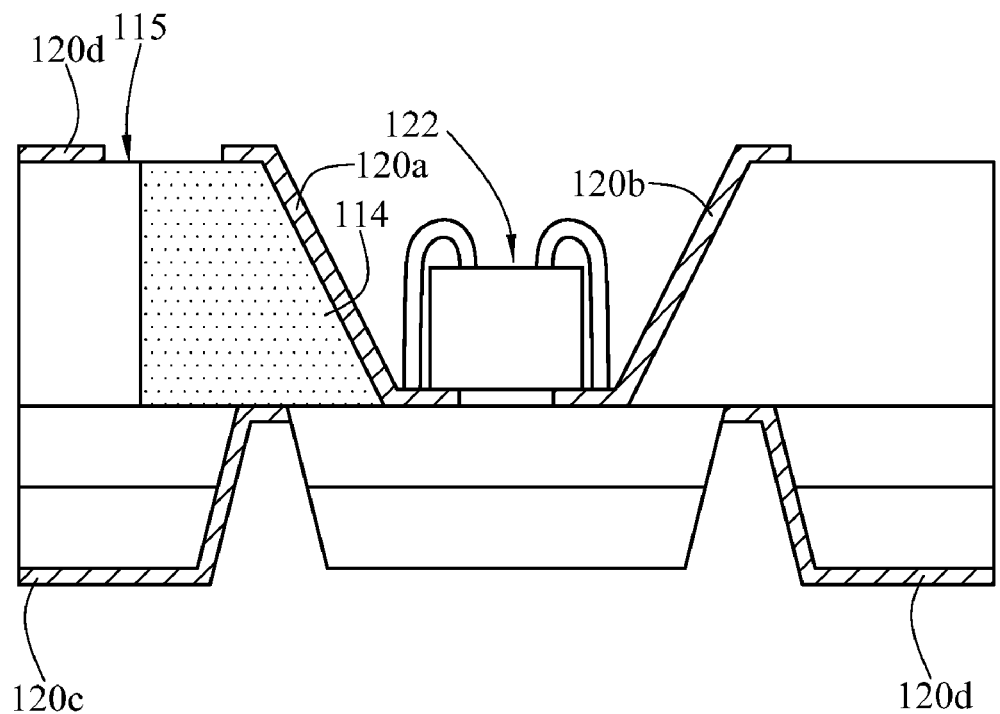

FIG. 7 shows a schematic sectional view of structure of an LED device having an ESD protection function according to a second embodiment of the present invention. The difference between the second embodiment and the first embodiment lies in that an N-type semiconductor region 114 having a larger doped region is formed in the first semiconductor region 102*a*, so as to form the embedded diode 115. Moreover, the third electrode 120*c* is electrically connected to the P-electrode end of the embedded diode 115 by the use of the embedded diode 115. Otherwise, the positions of the first to fourth electrodes 120*a*-120*d* are adjusted according to different requirements, as shown in FIGS. 8-9. Since this part has been described in detail in the first embodiment, and persons skilled in the art may adjust the positions of the electrodes without departing from the spirit of the present invention, the details will not be repeated herein again. And, when the first silicon substrate 102 has a larger thickness, a doped region having a large thickness may be formed, so as to form the embedded diode 215 as shown in FIGS. 8-9. On the contrary, if the first silicon substrate 102 has a smaller thickness, the formed doped region is a region of a smaller thickness.

Figure 10:
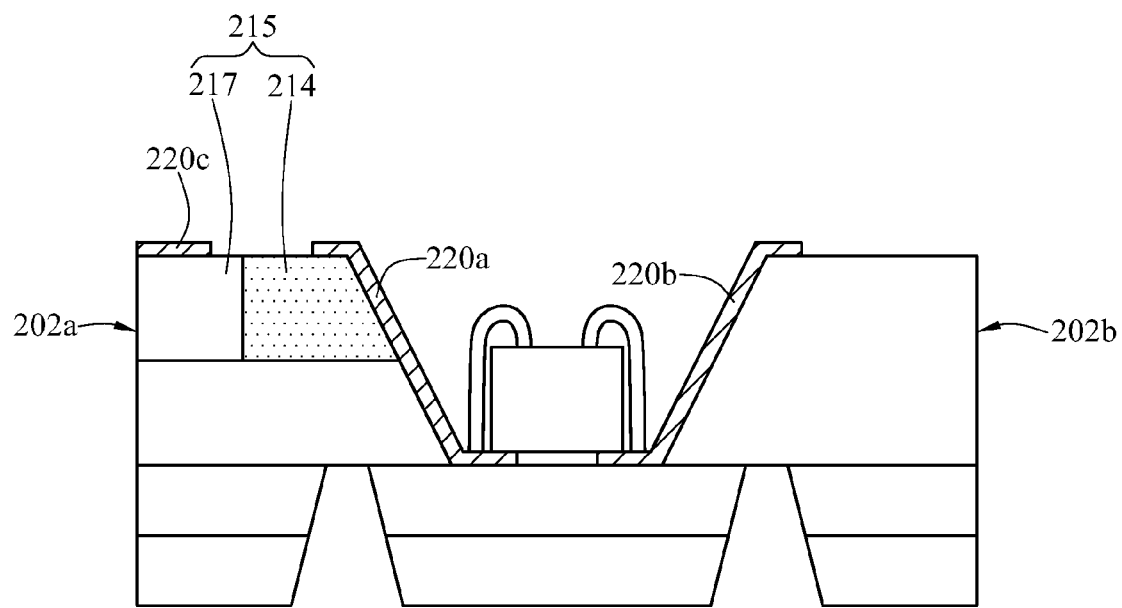
FIGS. 10-11 show schematic sectional structural views of an LED device having an ESD protection function according to a third embodiment of the present invention.
Figure 11:
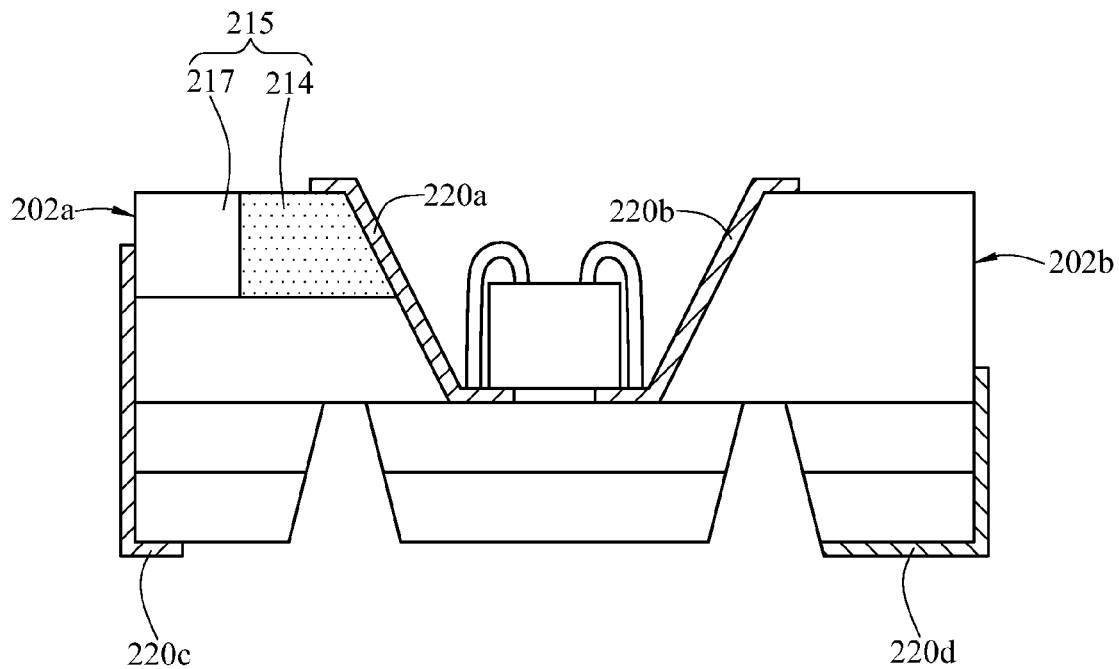

FIGS. 10-11 show schematic sectional views of structure of an LED device having an ESD protection function according to a third embodiment of the present invention. The difference between the third embodiment and the first embodiment lies in that a shallow ion implantation process is performed in the first semiconductor region 202*a*, so as to form an N-type semiconductor region 214 and a P-type semiconductor region 217 having a smaller depth. Thus, a embedded diode 215 is formed on the upper surface of the first semiconductor region 202*a*. Moreover, the third electrode 220*c* is electrically connected to the P-electrode end of the embedded diode 115 by the use of the structure of the embedded diode 215. Or, the positions of the first to fourth electrodes 220*a*-220*d* may be adjusted according to the requirements, as shown in FIG. 11. Since this part has been described in the above embodiment, and persons skilled in the art may adjust the positions of the electrodes without departing the spirit of the present invention, the details will be repeated herein again.

Figure 12:
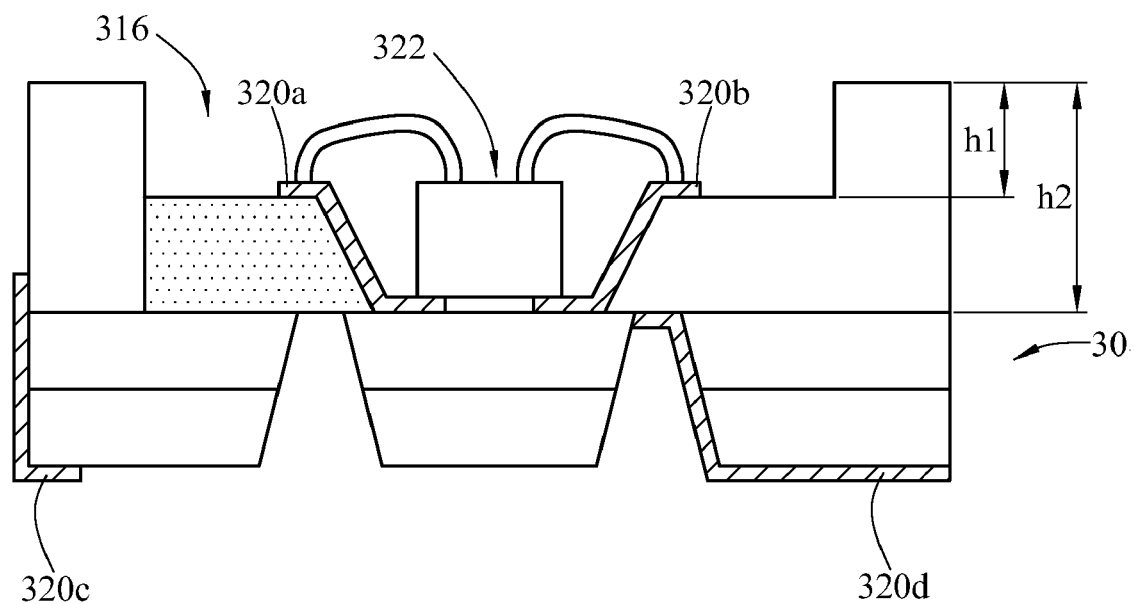
FIGS. 12-14 show schematic sectional structural views of an LED device having an ESD protection function according to a fourth embodiment of the present invention.
Figure 13:
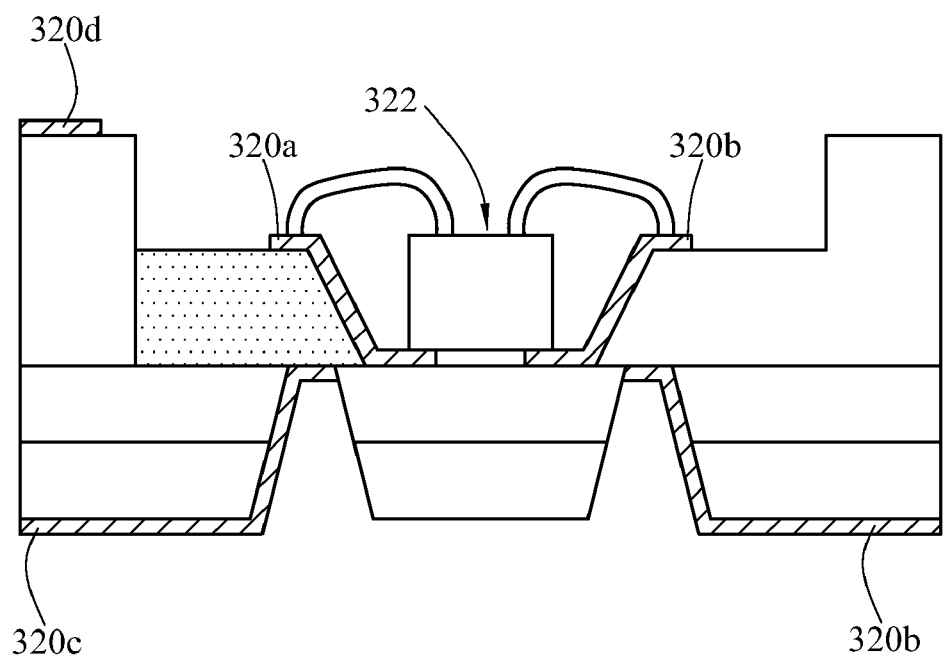
Figure 14:
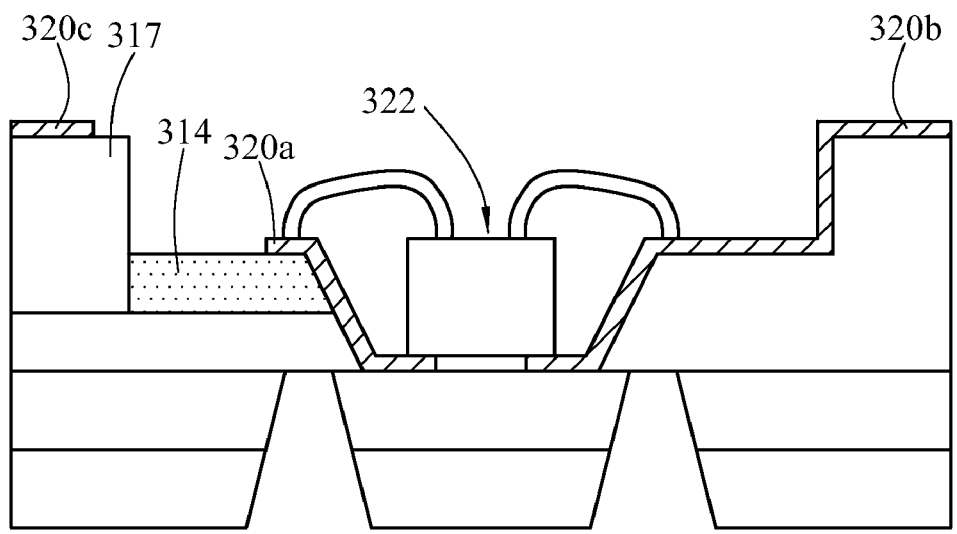

FIG. 12 shows a schematic sectional view of structure of an LED device having an ESD protection function according to a fourth embodiment of the present invention. The difference between the fourth embodiment and the fifth embodiment lies in that the groove 316 of the composite substrate 308 has a double depths, i.e., the groove 316 has a first depth h1 and a second depth h2, which facilitates the subsequent wire-bonding process for preparing the LED 322, i.e., the process for electrically connecting the two electrode ends of the LED 322 to the first electrode 320a and the second electrode 320b. Next, the positions of the first to fourth electrodes 320a-320d may be adjusted according to the requirements, as shown in FIG. 13, or the implantation depths of the N-type semiconductor region 314 and the P-type semiconductor region 317 may be changed, as shown in FIG. 14. Since this part has been described in the above embodiment, and persons skilled in the art may adjust the position of the electrode without departing from the spirit of the present invention, the details will not be repeated herein again.

Figure 15:
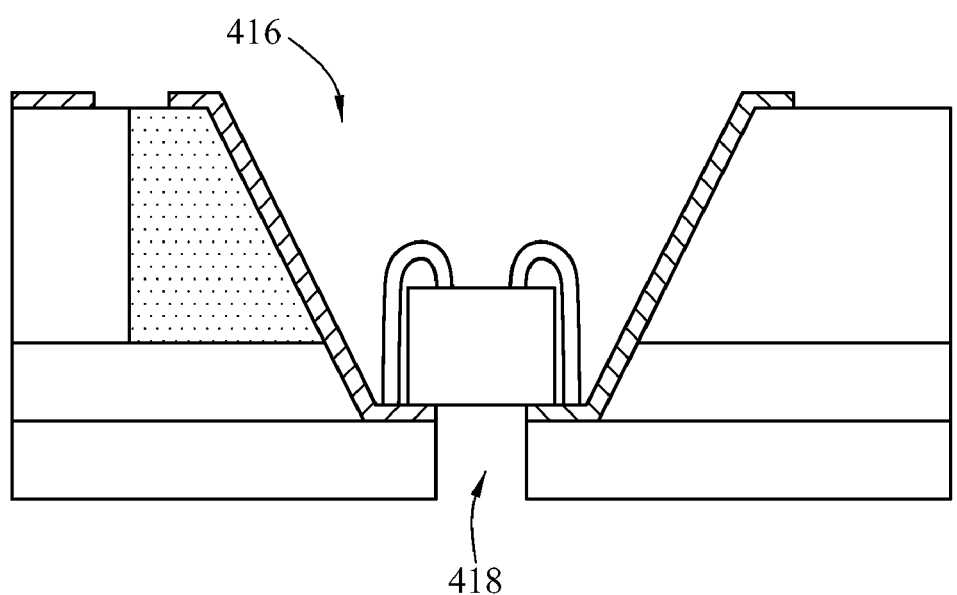
FIGS. 15-16 show schematic sectional structural views of an LED device having an ESD protection function according to a fifth embodiment of the present invention.
Figure 16:
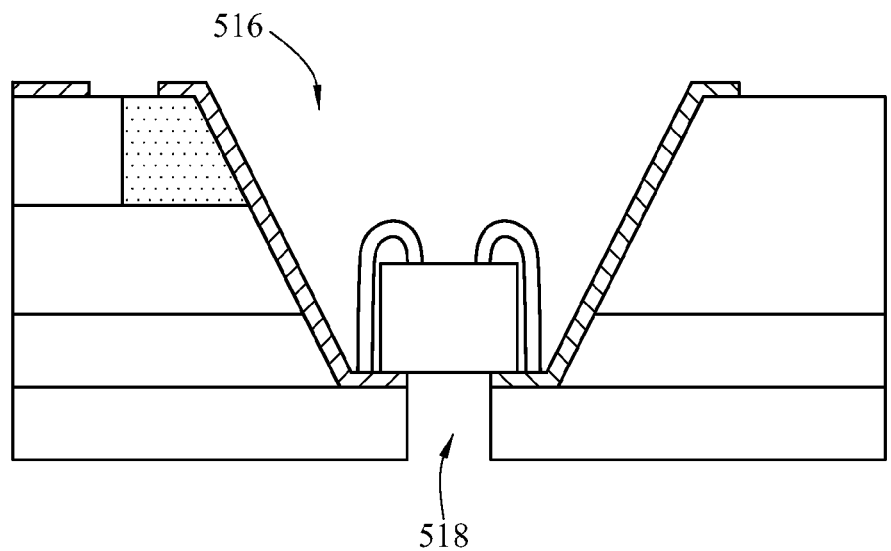
Figure 17:
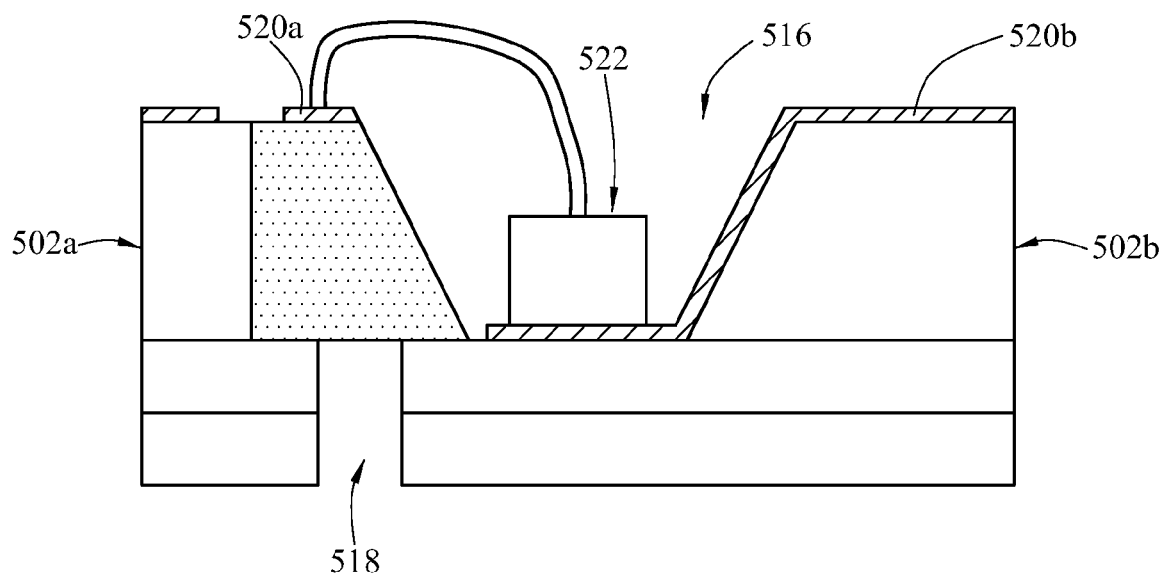
FIG. 17 shows a schematic sectional structural view of the LED device having an ESD protection function according to a sixth embodiment of the present invention.

FIGS. 15-16 show schematic sectional views of structure of an LED device having an ESD protection function according to a fifth embodiment of the present invention. The difference between the fifth embodiment and the first embodiment lies in that the isolation trench 418 is disposed at the middle of the bottom of the groove 416. Or, the LED may also be arranged according to different structures of the LED, such as a vertical LED (i.e., the two electrode ends are respectively disposed on the upper and lower surfaces of the LED), as shown in FIG. 17 of the sixth embodiment. Here, the isolation trench 518 and the groove 516 are disposed alternately. The first electrode 520a is disposed on the first semiconductor region 502a, and the second electrode 520b is disposed between the second semiconductor region 502b and the groove 516. The flip-chip type LED 522 is disposed in the groove 516 and has two electrode ends disposed on the two different surfaces. One electrode end is directly disposed on the second electrode 520b, and the other electrode end is electrically connected to first electrode 520a by the wire-bonding process. Since other structural features have been described above, the details will not be repeated herein again.

Figure 18A:
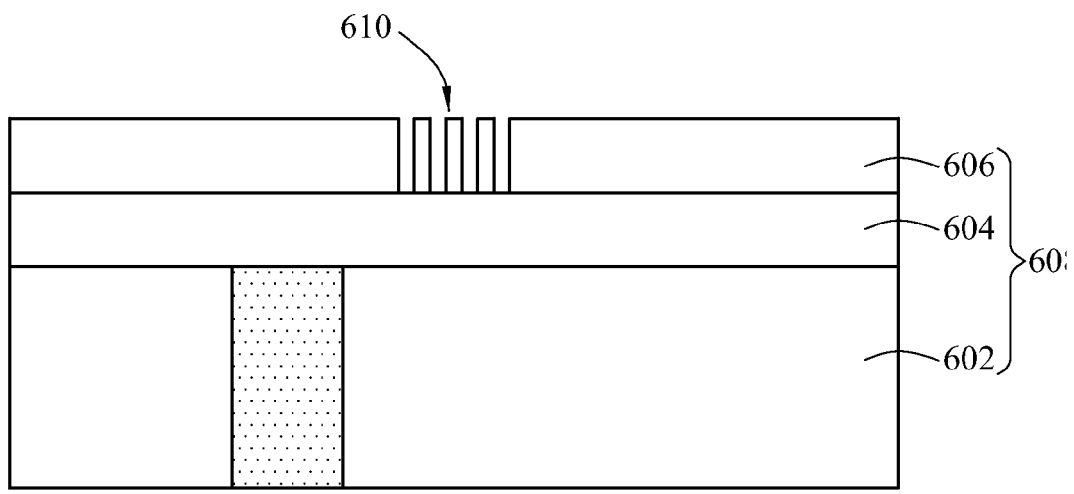
FIGS. 18A-18C show schematic flow charts of procedures of a method of fabricating an LED device having an ESD protection function according to a seventh embodiment of the present invention.
Figure 18B:
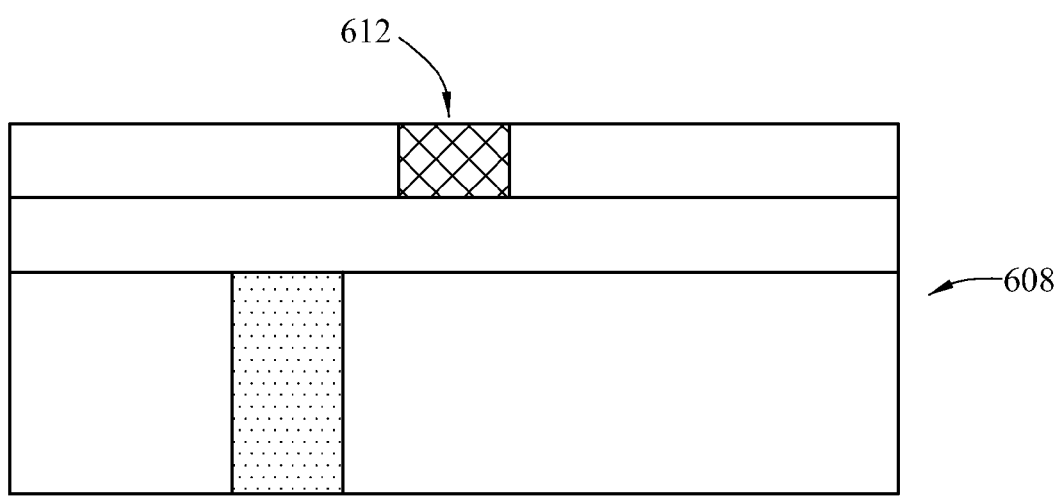
Figure 18C:
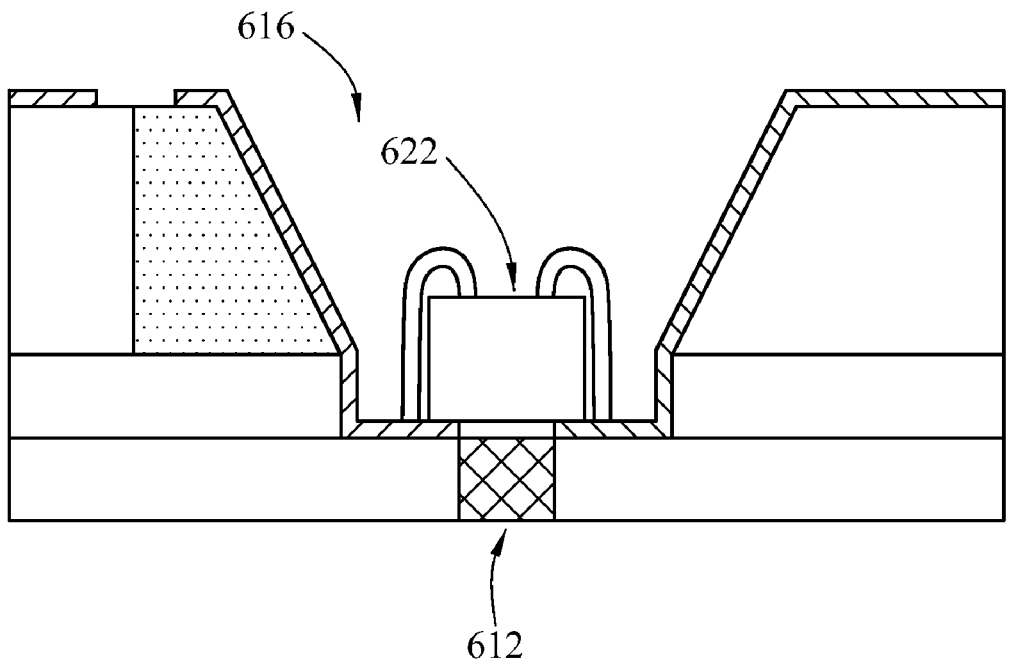

Moreover, an oxide layer may be further formed in the second silicon substrate to serve as the isolation trench in the first embodiment, so as to form a reinforcement structure. FIGS. 18A-18C show schematic flow charts of procedures of a method of fabricating an LED device having an ESD protection function according to a seventh embodiment of the present invention. The difference between the seventh embodiment and the first embodiment is described as follows. First, a doped region is formed in the first silicon substrate 602 of the composite substrate 608, a trench 610 is formed on the second silicon substrate 606, and the trench 610 is disposed on the surface of the insulating layer 604, as shown in FIG. 18A. After that, an oxide layer 612 is formed in the trench 610, and the excess oxide layer on the trench 610 is then removed, so as to complete the oxide layer 612 with the reinforcement function, as shown in FIG. 18B. Thereafter, the photolithography, etching, ion implantation processes are performed sequentially to prepare the desired groove 616. Finally, the LED 622 is disposed in the groove 616, and is electrically connected to the electrodes by means of wire bonding process, as shown in FIG. 18C. Since other structural features have been described above, the details will not be repeated herein again.

Figure 19:
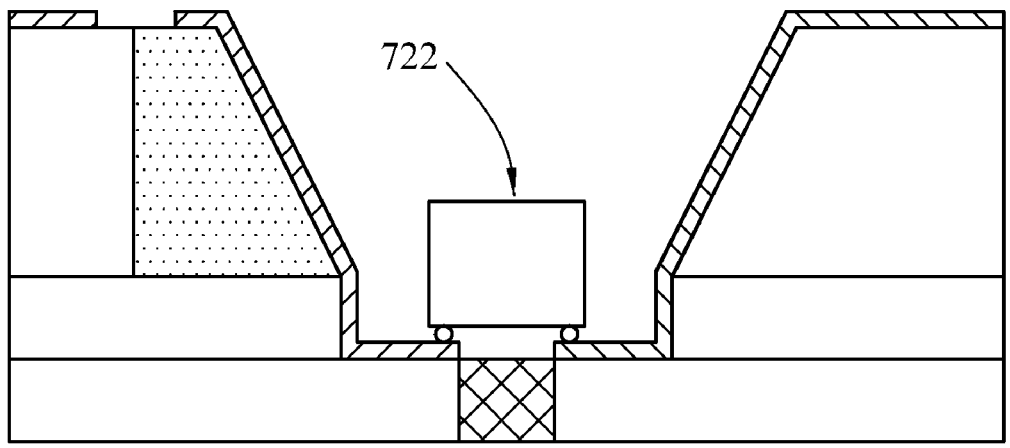
FIG. 19 shows a schematic flow chart of procedures of a method of fabricating an LED device having an ESD protection function according to an eighth embodiment of the present invention.

FIG. 19 shows a schematic flow chart of procedures of a method of fabricating an LED device having an ESD protection function according to an eighth embodiment of the present invention. The difference between the eighth embodiment and the seventh embodiment lies in that the LED 722 is a flip-chip type LED. Since other structural features have been described above, the details will not be repeated herein again.

Figure 20:
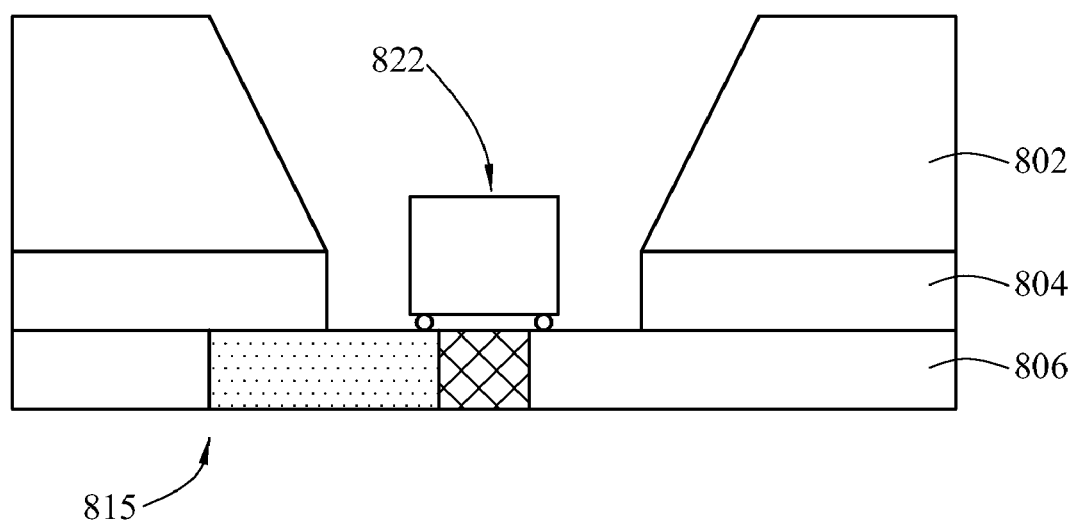
FIG. 20 is a schematic structural view of an LED device having an ESD protection function according to a ninth embodiment of the present invention.

FIG. 20 is a schematic structural view of an LED device having an ESD protection function according to a ninth embodiment of the present invention. The difference between the ninth embodiment and the eighth embodiment lies in that in the eighth embodiment, the ion implantation process is performed in the first silicon substrate, but in the ninth embodiment, the ion implantation process is performed in the second silicon substrate 806 to form the embedded diode 815. The LED 822 is disposed in the groove opened on the first silicon substrate 802 in the form of the flip-chip type LED. Since other structural features have been described above, the details will not be repeated herein again.

Figure 21:
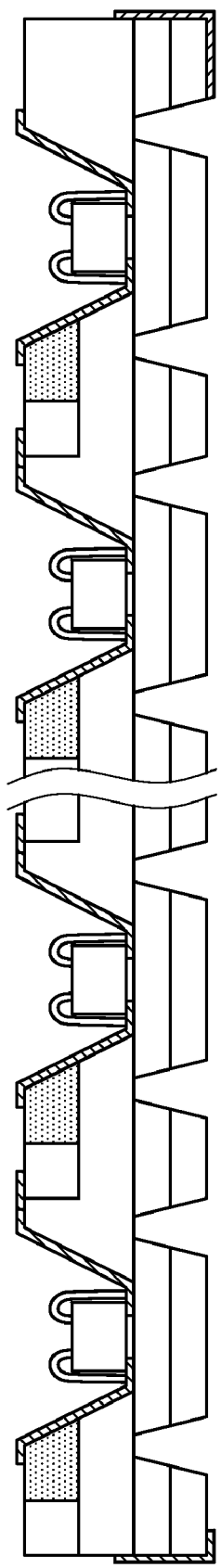
FIG. 21 is a schematic structural view of an LED device having an ESD protection function according to a tenth embodiment of the present invention.

FIG. 21 is a schematic structural view of an LED device having an ESD protection function according to a tenth embodiment of the present invention. In brief, the LED package of the present invention may be an array LED package, as shown in FIG. 21, wherein the LED package in the third embodiment (as in FIG. 11) is a structure having an array arrangement.

In view of the above, the LED package device having an ESD protection function has the following advantages.

1. Since the composite substrate has the insulating layer for providing the electrical isolation function, the insulating layer may be used to electrically isolate the array LED structure, i.e., to isolate the embedded diodes in the array structure. In this manner, the effect of dissociative components of semiconductor device is alleviated, and further the problem of current leakage is solved. Therefore, the capability of the ESD protection circuit for excluding the current may be enhanced, thereby improving the capability of ESD protection and electrical over stress (EOS) of the overall circuit.

2. The embedded diode design in the LED structure having an ESD protection function provided in the present invention may further produce the capacitance effect when being reverse biased or forward biased. The resistance-capacitance (RC) may also increase the time of surge, i.e., the RC delay time at the level of µs that is 1000 times greater than the ESD at the level of ns. Therefore, the propagation time of the surge may be greatly increased, thereby improving the capability of the circuit in resisting the ESD.

What is claimed is:
1. An light-emitting diode (LED) package having an electrostatic discharge (ESD) protection function, comprising:
   a composite substrate, comprising a first semiconductor region, a second semiconductor region, and a groove located between the first semiconductor region and the second semiconductor region;
   a first electrode, disposed between the first semiconductor region and the groove;
   at least one second electrode, disposed in the first semiconductor region or between the second semiconductor region and the groove, wherein the first electrode is electrically insulated from the second electrodes, and the second electrodes are electrically connected to each other;
   at least one LED, disposed in the groove and having two electrode ends electrically connected to the first electrode and one of the second electrodes respectively; and
   an embedded electronic device, embedded in the first semiconductor region and having two electrode ends, wherein the two electrode ends of the embedded electronic device are electrically connected to the first electrode and another second electrode respectively, the embedded electronic device includes at least one embedded diode, and a forward bias direction of the embedded diode relative to the first electrode and the second electrodes is opposite to that of the LED relative to the first electrode and the second electrodes.

2. The LED package having an ESD protection function according to claim 1, wherein the groove has a reflecting layer on its inner surface for reflecting light generated by the LED.

3. The LED package having an ESD protection function according to claim 1, wherein the composite substrate further comprises an insulating layer and a silicon substrate disposed on the insulating layer, and the first semiconductor region, the second semiconductor region, and the groove are disposed corresponding to the silicon substrate on the insulating layer.

4. The LED package having an ESD protection function according to claim 3, wherein the composite substrate further comprises an isolation trench recessing from the silicon substrate to the insulating layer and disposed corresponding to the groove, so as to divide the composite substrate into a positive electrode contact surface and a negative electrode contact surface of the composite substrate.

5. The LED package having an ESD protection function according to claim 4, further comprising a plurality of third electrodes respectively disposed on the positive electrode contact surface and the negative electrode contact surface, so as to electrically connect a circuit board.

6. The LED package having an ESD protection function according to claim 1, wherein the LED is a flip-chip type LED.

7. The LED package having an ESD protection function according to claim 1, wherein the embedded diode comprises an N-type semiconductor region and a P-type semiconductor region, wherein the N-type semiconductor region and the P-type semiconductor region are two electrode ends.

8. The LED package having an ESD protection function according to claim 1, wherein the embedded diode has a plurality of PN junction interfaces.

9. The LED package having an ESD protection function according to claim 1, wherein the groove has a first depth and a second depth.

10. The LED package having an ESD protection function according to claim 1, further comprising an encapsulating filling disposed in the groove.

11. The LED package having an ESD protection function according to claim 10, wherein the encapsulating filling is one selected from among epoxy resin, silicon gel, polymer, and any combination thereof.

12. The LED package having an ESD protection function according to claim 10, wherein the encapsulating filling is in a form of at least one lens.

13. The LED package having an ESD protection function according to claim 1, wherein the embedded electronic device further comprises a resistor connected in series with the embedded diode.

14. The LED package having an ESD protection function according to claim 3, wherein the silicon substrate has a thickness of 0.1 μm to 500 μm.

15. The LED package having an ESD protection function according to claim 1, wherein the LED package is a package having an array arrangement.

16. The LED package having an ESD protection function according to claim 1, wherein a number of the LED is more than one.

17. A method of fabricating a light-emitting diode (LED) package having an electrostatic discharge (ESD) protection function, comprising:
providing a composite substrate that comprises a first silicon substrate, an insulating layer, and a second silicon substrate arranged in sequence;
forming a embedded diode in the first silicon substrate;
forming a groove in the first silicon substrate, wherein the groove is adjacent to the embedded diode, and recesses from a first surface of the first silicon substrate to a second surface of the first silicon substrate, so as to separate two independent semiconductor regions;
forming at least one isolation trench in the second silicon substrate and the insulating layer, wherein the isolation trench recesses from a first surface of the second silicon substrate to a second surface of the insulating layer, and the groove is disposed corresponding to the isolation trench, for dividing the composite substrate into a positive electrode contact surface and at least one negative electrode contact surface of the composite substrate;
forming a plurality of electrodes respectively on the positive electrode contact surface and the negative electrode contact surface, for defining a positive electrode and a negative electrode of the composite substrate, wherein the composite substrate is electrically connected to the embedded diode, and an electrode direction of the embedded diode is opposite to that of the composite substrate; and
disposing at least one LED in the groove, wherein the LED has a positive electrode and a negative electrode electrically connected to the positive electrode and the negative electrode of the composite substrate respectively.

18. The method of fabricating an LED package having an ESD protection function according to claim 17, wherein the step of forming the embedded diode comprises doping a semiconductor having a different type from the first silicon substrate in the first silicon substrate, so as to form at least one PN junction interface in the first silicon substrate.

19. The method of fabricating an LED package having an ESD protection function according to claim 17, wherein the groove has a first depth and a second depth.

20. The method of fabricating an LED package having an ESD protection function according to claim 17, after the step of disposing the LED in the groove, further comprising forming a encapsulating filling in the groove to cover the LED.

21. The method of fabricating an LED package having an ESD protection function according to claim 20, wherein the encapsulating filling is in a form of at least one lens.

22. The method of fabricating an LED package having an ESD protection function according to claim 17, wherein the first silicon substrate has a thickness of 0.1 μm to 500 μm.

23. The method of fabricating an LED package having an ESD protection function according to claim 17, wherein the LED is a flip-chip type LED.

24. An electrostatic discharge (ESD) protection system for a light-emitting diode (LED), comprising:
a composite substrate, comprising a first silicon substrate, an insulating layer, and a second silicon substrate arranged in sequence, wherein the composite substrate has a groove and an isolation trench corresponding to the groove, the groove and the isolation define the composite substrate as a contact surface positive electrode and a contact surface negative electrode of the composite substrate, the composite substrate further comprises an ESD protection circuit embedded in the first silicon substrate and the second silicon substrate alternatively; and
an LED, disposed in the groove and having two electrode ends which are electrically connected to the positive electrode contact surface and the negative electrode contact surface respectively, and being electrically connected to the ESD protection circuit, wherein an electrode direction of the ESD protection circuit is opposite to that of the LED.

25. The ESD protection system for an LED according to claim 24, wherein the composite substrate further comprises a plurality of metal wires respectively disposed on the positive electrode contact surface and the negative electrode contact surface, for defining a positive electrode and a negative electrode of the composite substrate.

26. The ESD protection system for an LED according to claim 24, wherein the ESD protection circuit has a diode having at least one PN junction interface.

27. The ESD protection system for an LED according to claim 24, wherein the ESD protection circuit further comprises a resistor connected in series with the ESD protection circuit.

28. The ESD protection system for an LED according to claim 24, further comprising a encapsulating filling disposed in the groove to cover the LED.

29. An light-emitting diode (LED) package having an electrostatic discharge (ESD) protection function, comprising:

a composite substrate, comprising a first semiconductor region, a second semiconductor region, and a groove located between the first semiconductor region and the second semiconductor region, the groove defines the composite substrate as a positive electrode contact surface and a negative electrode contact surface of the composite substrate;

at least one LED, disposed in the groove and having two electrode ends electrically connected to the positive electrode contact surface and the negative electrode contact surface respectively; and an embedded electronic device, embedded in the first semiconductor region and having two electrode ends, wherein the two electrode ends of the embedded electronic device are electrically connected to the positive electrode contact surface and the negative electrode contact surface respectively.

* * * * *